United States Patent [19]

Metzka

[11] Patent Number: 4,988,426

[45] Date of Patent: Jan. 29, 1991

[54] HOLDING APPARATUS FOR ARTICLES TO BE ELECTROPLATED

[75] Inventor: Hans J. Metzka, Nuremberg, Fed. Rep. of Germany

[73] Assignee: Metzka GmbH, Schwanstetten, Fed. Rep. of Germany

[21] Appl. No.: 535,964

[22] Filed: Jun. 11, 1990

[30] Foreign Application Priority Data

Aug. 31, 1989 [DE] Fed. Rep. of Germany ... 8910413[U]

[51] Int. Cl.$^5$ .............................................. C25D 17/08
[52] U.S. Cl. ............................ 204/297 R; 204/297 W
[58] Field of Search ....................... 204/297 R, 297 W

[56] References Cited

U.S. PATENT DOCUMENTS

| 2,760,929 | 8/1956 | Shepard et al. | 204/297 W X |
| 3,785,952 | 1/1974 | Ritzenhoff | 204/297 W |
| 4,014,778 | 3/1977 | Harrison | 204/297 W |
| 4,421,627 | 12/1983 | LeBaron | 204/197 W |
| 4,606,891 | 8/1986 | Murphy, Jr. et al. | 204/297 W X |
| 4,889,494 | 12/1989 | Kunz | 204/297 W X |

Primary Examiner—Donald R. Valentine

[57] ABSTRACT

A holding apparatus for articles to be electroplated has upstanding bar elements with contact members for holding and contacting the articles which are supplied to the holding apparatus from the front thereof. Provided at the rear of the holding apparatus and spaced from the bar elements are upright columns along which elongate transverse elements are displaceable and can be arrested thereon. The transverse elements carry support devices such as piston-cylinder units with support members for the articles, so that the support members can be positioned in a plane in which adjacent bar elements extend, for supporting the articles.

7 Claims, 1 Drawing Sheet

1

HOLDING APPARATUS FOR ARTICLES TO BE ELECTROPLATED

BACKGROUND OF THE INVENTION

There are many requirements nowadays for articles to be subjected to an electroplating operation, for example printed circuit boards. To carry out such an operation, the articles are disposed on a suitable holding apparatus on which they are then introduced into an electroplating installation.

One form of such a holding apparatus for articles to be electroplated comprises bar elements which are preferably in the form of what are known as rotary bars. The bar elements are provided with contact members for contacting of the articles to be electroplated, the articles being fed to the contact members from the front side of the holding apparatus. The contact members are for example elements of a generally hook-like configuration which are disposed on the bar elements. With a typical holding apparatus of that kind, it is possible for a single article to be electroplated to be clamped fast in position between a pair of adjacent bar elements, by means of the contact members, which also provide for a electrically conductive contact therewith. That means however that the through-put capacity in respect of articles to be electroplated on such a holding apparatus, for example printed circuit boards, is relatively low.

SUMMARY OF THE INVENTION

An object of the present invention is to provide a holding apparatus for articles to be subjected to an electroplating operation, such as printed circuit boards, which permits more than one such article to be disposed and electrically conductively contacted between adjacent bar elements thereof.

Another object of the present invention is to provide a holding apparatus for articles to be electroplated, which is of a rationalised and highly organised configuration to permit an increase in the through-put rate of such articles.

Still another object of the present invention is to provide a holding apparatus for articles such as printed circuit boards to be electroplated, which involves at least a degree of mechanisation in regard to mounting articles thereon prior to electroplating.

In accordance with the present invention these and other objects are achieved by a holding apparatus for articles to be electroplated, such as printed circuit boards, comprising bar elements provided with contact members for holding and contacting said articles, the articles being fed to the apparatus from the front side thereof. Provided at the rear side of the apparatus and at a spacing therefrom are columns carrying elongate transverse elements which are disposed thereon in such a way that they can be displaced therealong and arrested thereon. Arranged on the transverse elements are support devices including support members for respective articles to be electroplated. The support members for supporting the articles can be arranged in the plane in which adjacent bar elements of the holding apparatus extend.

As will be seen in greater detail hereinafter in a description of a preferred embodiment of the invention, the fact that the support devices are disposed at the rear side of the holding apparatus, means that the holding apparatus can be easily loaded with the articles from the front side thereof, without the loading apparatus being impeded by the support devices. The operation of loading the holding apparatus can be effected annually or at least semi-automatically, for example by means of a programmable robot of conventional nature.

The fact that the elongate transverse elements are displaceable on the associated columns in the direction of the height of the holding apparatus means that it is possible for articles of any widthwise dimensions to be reliably secured to the holding apparatus, with the lengthwise dimension of each article corresponding to the distance between adjacent bar elements and preferably being constant. Accordingly the provision of the support devices means that it is possibly to reliably secure and contact not only articles of the same size, but in addition it is possible for articles of different widthwise dimensions and a constant lengthwise dimension to be securely held and contacted in one and the same holding apparatus. Thus, a plurality of, for example three, articles to be electroplated may be arranged between a pair of adjacent bar elements of the holding apparatus, while between another pair of adjacent bar elements it is possibly to arrange a greater or smaller plurality of articles, on the same holding apparatus. That means that the holding apparatus according to the invention affords a wide area of use thereof, in that it can be employed with a wide range of variations in dimensions of the articles to be electroplated on the holding apparatus.

The articles to be electroplated, such as printed circuit boards, are held at a spacing from each other by means of the support members of the support devices so that the edge portions of the respective articles can also be easily electroplated. For that purpose, the support members are preferably each of a lance-like configuration in order to form a relatively small contact area for the respective articles to be supported thereon. The support members of the holding apparatus in accordance with the principles of this invention can be displaced in at least two different directions in space and as a result can be easily adapted to the dimensions of articles to be arranged between adjacent bar elements of the apparatus.

In a preferred feature of the invention, in order still further to enhance the range of displacement and adjustment of the individual support members of the support devices, the support devices may be adapted to be displaced on and arrested on the associated elongate transverse elements. That design configuration of the holding apparatus means that it is possible for each individual support device to be displaced and arrested as desired with respect to the associated elongate transverse element on which it is disposed, but at the same time it is also possible for each support member to be displaceable with respect to the support device and/or the associated transverse element to be adapted to be displaced along and arrested on the associated column.

In an advantageous and preferred feature of the invention, the support devices are adapted to be displaced longitudinally along the respective transverse element. It would also be possibly for the individual support devices to be designed to be pivotably with respect to the associated transverse elements about the longitudinal axis of the corresponding transverse element.

Preferably, the support members of the support devices are displaceable relative to the transverse elements in a plane which is normal to the corresponding elongate transverse element. That means that each individual support member can pass at least approximately perpendicularly through the plane in which the adjacent bar elements are disposed, and thus the plane of the articles which are arranged between adjacent bar elements. In that way, a respective article to be electroplated can be supported by means of at least two support members until the articles is securely held fast and electrically conductively contacted by means of the contact members on the bar elements. As soon as the articles to be electroplated have been secured in position in that way, the support members can be returned into a rest position in which they are moved away from the respective articles.

The holding apparatus can be of a particularly compact configuration, without adverse effect on the operational reliability thereof, if, in accordance with a preferred feature, each support device with its associated support member is arranged at an angle to the plane of associated adjacent bar elements of the holding apparatus, which angle is different from 90°. In that situation the individual support devices are arranged in an inclined position with respect to the bar elements of the holding apparatus, at a certain angle, so that the support devices constitute a compact array. So that the holding apparatus still ensures that the articles to be electroplated, which are to be secured between adjacent bar elements, are still securely and reliably supported in position, when the support device are disposed in the above-discussed compact array, with respect to the bar elements, each support member is preferably provided with a support surface which is disposed at least approximately perpendicularly to the plane of associated adjacent bar elements of the holding apparatus.

In another particularly advantageous feature, the support surfaces of the support members are inclined with respect to the plane in which adjacent bar elements are disposed, in such a way that the effect of the force of gravity on the individual articles to be electroplated ensures that they bear securely against the contact members on the bar elements.

The holding apparatus according to the invention can be of a simple design configuration if, in accordance with a preferred feature of the invention, first and second support devices are operatively associated with each pair of bar elements on each transverse element. The support devices may be hydraulic drive units with piston rods on which the respective support members can be mounted or in some other way provided thereon.

It would also be possible for the support devices to be in the form of electric motor units.

Further objects, features and advantages of the apparatus according to the invention will be more clearly apparent from the following description of a preferred embodiment thereof.

DESCRIPTION OF THE PREFERRED EMBODIMENT

Figure 1:
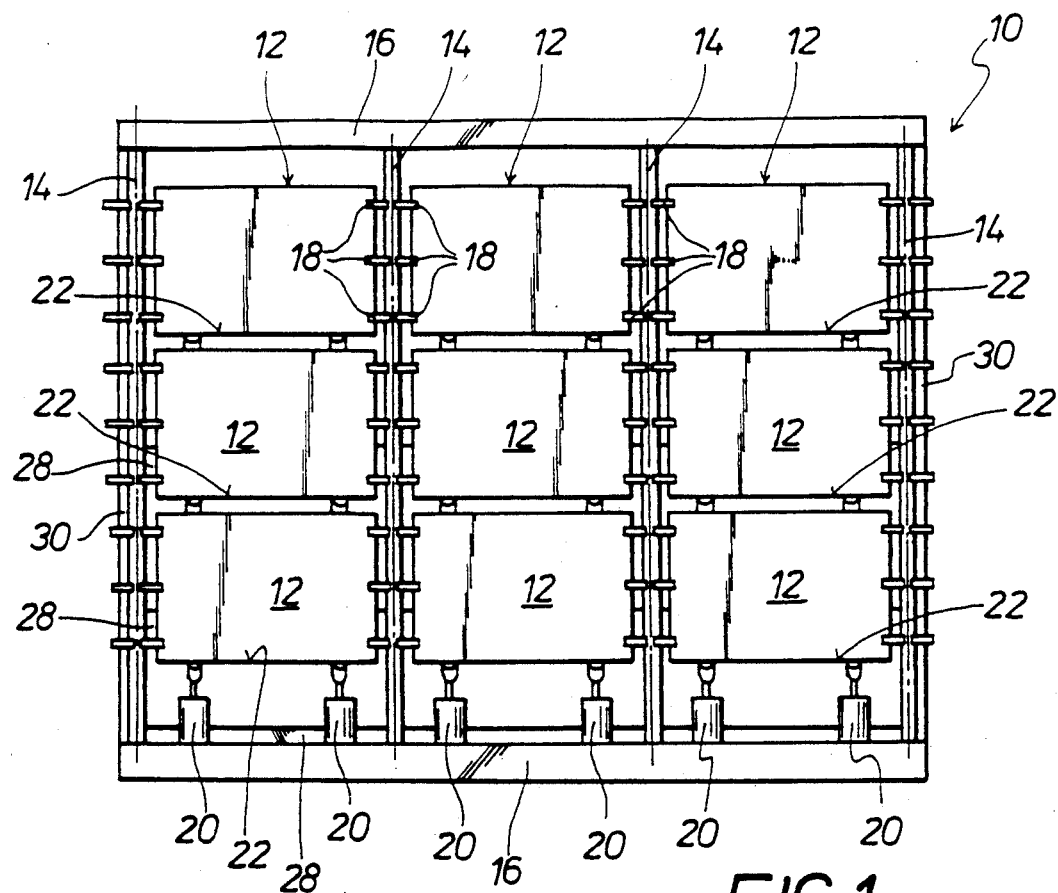
FIG. 1 is a view of the holding apparatus according to the invention, from the front side thereof.

Referring generally to the drawing, shown therein is a holding apparatus 10 for articles 12 to be electroplated, for example and more particularly printed circuit boards. The holding apparatus 10 comprises a plurality of bar elements 14 which are disposed at spacings from each other and which extend in mutually parallel relationship, being at least substantially vertical in the front view shown in FIG. 1. The bar elements 14 are carried on rail elements 16 at the top and bottom of the apparatus, with the rail elements 16 extending at least approximately horizontally in the view shown in FIG. 1.

The bar elements 14 are provided with pluralities of contact members indicated at 18, which serve to hold fast the articles 12 to be electroplated, and also for electrically conductive contacting thereof.

The bar elements 14 may be rotary bar elements, of per se known configuration, so that there is no need herein to set forth further details of the design configuration thereof.

So that a plurality of articles 12 can be appropriately arranged between adjacent bar elements 14, the holding apparatus 10 further includes a plurality of support devices 20 with which the articles 12 can be supported in an accurately defined condition by way of their lower edges as indicated at 22, until the articles 12 are held fast in position and also electrically conductively contacted by means of the contact members 18 on the bar elements 14.

Figure 2:
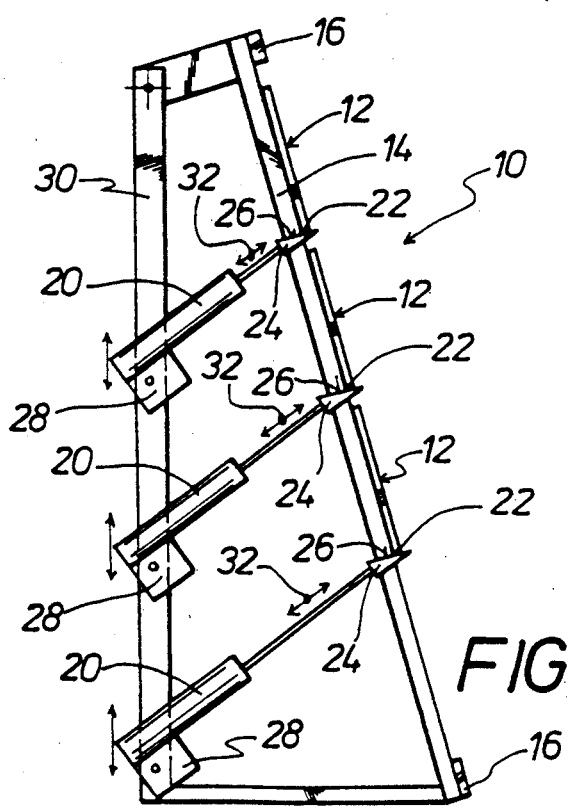
FIG. 2 is a side view of the FIG. 1 apparatus.

Referring now to FIG. 2, it can be clearly seen therefrom that each support device 20 comprises a support member 24. Each support member 24 has a support surface indicated at 26, on which the respective article 12 to be galvanized is supported by means of its lower edge 22 when the corresponding support device 20 is in its active operative position, being the position shown in respect thereof in FIG. 2.

The support devices 20 are carried on elongate transverse members 28 which are disposed on columns 30 in such a way that they can be displaced therealong and arrested thereon. The columns 30 are disposed at the rear side of the holding apparatus 10, that is to say the side which is at the left in FIG. 2. The articles 12 are supplied to the holding apparatus to be mounted thereon, from the front side thereof, which is thus towards the right in FIG. 2.

The support devices 20 can be arranged to be displaceable in the longitudinal direction of the associated transverse elements 28. The support members 24 of the individual support devices 20 are movable in relation to the corresponding support devices 20, as indicated by the double-headed arrows 32 in FIG. 2. For that purpose, the support devices 20 may be for example hydraulically operated piston-cylinder units, with the support member 24 being carried on the respective piston rod of the unit. By virtue of that element of the support members 24, they can be displaced between a rest position in which they are retracted from the line of the bar elements 14, and an active operative position in which the support members 24 extend into and possibly through the plane in which the adjacent bar elements 14 are disposed, so that a respective article 12 can be supported in a precisely defined position by means of its bottom edge 22 on the support surfaces 26 of preferably a pair of associated support devices 20.

As soon as the entire holding apparatus 10 has been loaded with articles 12, or as soon as the appropriate number of articles 12 has been fitted on to the holding apparatus 10, and the articles 12 on the apparatus 10 are securely held in position and electrically conductively contacted by means of the contact members 18 on the bar elements 14, the support devices 20 are retracted from the active position shown in FIG. 2 into an inactive rest position as referred to above, in which the support members 24 no longer extend into the planes defined by the adjacent bar elements 14. In that way, the holding apparatus 10 with the articles 12 secured and electrically conductively contacted by the contact members 18 on the bar elements 14, can be introduced into an electroplating installation.

It will be further seen from FIG. 2 that the support members 24 of the support devices 20 are displaceable with respect to the transverse elements 28 in a plane normal to the corresponding elongate transverse element 28, while each support device 20 with its associated support member 24 is disposed at an angle different from 90° to the plane of the associated adjacent bar elements 14. The support surface 26 of each support member 24 is disposed at least approximately perpendicularly to the plane of the adjacent bar elements 14, with preferably first and second support devices operatively associated with each pair of bar elements 14, on each transverse element 28.

It will be appreciated that the above-described construction has been set forth solely by way of example and illustration of the principles of the present invention and that various modifications and alterations may be made therein without thereby departing from the spirit and scope of the invention.

I claim:

1. A holding apparatus for articles to be electroplated, comprising upstanding bar elements, contact members on the bar elements for contacting of the articles to be electroplated which are supplied from the front size of the holding apparatus, columns disposed at the rear side of the apparatus at a spacing, elongate transverse elements disposed on said columns and adapted to be displaced therealong and arrested thereon, and support devices on the transverse elements, with support members for supporting the articles, wherein the support members for supporting the articles are adapted to be arranged in the plane in which adjacent bar elements extend.

2. A holding apparatus as set forth in claim 1 wherein said support devices are displaceably and arrestably disposed on the associated transverse elements.

3. A holding apparatus as set forth in claim 1 wherein the support members of the support devices are adapted for displacement with respect to the transverse elements in a plane normal to the corresponding transverse element.

4. A holding apparatus as set forth in claim 1 wherein each support device with the associated support member is arranged at an angle different from 90° to the plane of associated adjacent bar elements.

5. A holding apparatus as set forth in claim 1 wherein each support member has a support surface disposed at least approximately perpendicularly to the plane of associated adjacent bar elements.

6. A holding apparatus as set forth in claim 1 wherein first and second said support devices are associated with each pair of adjacent bar elements on each transverse element.

7. A holding apparatus for supporting articles to be electroplated, comprising a plurality of substantially upright columns disposed in a line at spacings from each other, a plurality of at least substantially horizontally extending elongate transverse elements carried by said columns displaceably thereon, means for securing said transverse elements to said columns, a plurality of upstanding bar elements disposed at spacings from each other and extending in a line at least substantially parallel to the line of columns at a spacing therefrom, a plurality of contact members on the bar elements for holding and electrically conductively contacting said articles, a plurality of support devices carried on the transverse elements and each including a member extensible towards said line of bar elements, and a support member on said extensible member of each support device and adapted by extension of said extensible member to be positioned in the plane of the line of said bar elements.

* * * * *